United States Patent
Zhou et al.

(10) Patent No.: US 11,133,792 B1
(45) Date of Patent: Sep. 28, 2021

(54) PRE-DRIVE LEVEL SHIFTER WITH COMPACT BIAS GENERATOR

(71) Applicant: QUALCOMM Incorporated, San Diego, CA (US)

(72) Inventors: Qubo Zhou, San Diego, CA (US); Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/885,137

(22) Filed: May 27, 2020

(51) Int. Cl.
H03K 3/356 (2006.01)
H03F 3/24 (2006.01)

(52) U.S. Cl.
CPC ....... *H03K 3/356113* (2013.01); *H03F 3/245* (2013.01); *H03F 2200/451* (2013.01)

(58) Field of Classification Search
CPC ......... H03K 3/356113; H03K 19/0175; H03K 19/0185; H03F 3/245; H03F 2200/451

USPC .................................................. 327/333
See application file for complete search history.

(56) References Cited

U.S. PATENT DOCUMENTS

| | | | |
|---|---|---|---|
| 6,301,154 B1 * | 10/2001 | Sumitani | G11C 15/046 365/185.18 |
| 2014/0184299 A1 * | 7/2014 | Chung | H03K 17/102 327/333 |
| 2015/0280714 A1 * | 10/2015 | Kumar | H03K 19/0185 327/333 |

* cited by examiner

*Primary Examiner* — John W Poos
(74) *Attorney, Agent, or Firm* — Seyfarth Shaw LLP

(57) ABSTRACT

A level shifter includes a compact bias generator. The compact bias generator generates a first bias signal and a second bias signal, in the absence of a buffer. The level shifter also includes a first latch in a first stage to translate a first voltage to a second voltage based on the first bias signal. The level shifter further includes a second latch in a second stage to translate the first voltage to a third voltage based on the second bias signal. The first bias signal is independent of the second bias signal.

16 Claims, 6 Drawing Sheets

PRE-DRIVE LEVEL SHIFTER WITH COMPACT BIAS GENERATOR

TECHNICAL FIELD

The present disclosure generally relates to a power supply architecture. More specifically, the present disclosure relates to a level shifter with reduced time for shifting between supply voltage levels and reduced bias generator size.

BACKGROUND

Wireless communications devices include a power amplifier (PA) to provide transmit power for an output radio frequency (RF) signal. The wireless or mobile communications devices include the power amplifier to amplify an input RF signal to a desired level for transmission, which may depend on how far the user is away from a base station. Next generation wireless systems use a wideband technology that allows for simultaneously transmitting multiple transmit signals, corresponding to different baseband signals, to one or more base stations over multiple channels. Some mobile communications devices specify transmitting the multiple transmit signals using a single power amplifier.

Because power amplification consumes power, techniques to improve the efficiency of power amplifiers may be implemented in wireless communications devices in order to prolong operation on a battery charge.

Level shifters are used in digital electronics such as smartphones, mobile computing devices, and other wireless communications devices. Level shifters change voltage levels from one state to another. Conventional level shifters, which transform a low voltage level to a high voltage level, may include several design challenges. Conventional level shifters may specify protection devices to ensure reliability as gate oxides of various transistors within the level shifter circuit may be vulnerable to damage from higher voltages. The increased complexity of protection devices within the level shifter circuit may lead to an undesirable increase in form factor (e.g., circuit area). Moreover, the additional circuitry generally leads to increased signal propagation delay, which ultimately limits a maximum operational speed of the digital electronics. The increased propagation delay may result in greater dispersion in the timing tolerance for signal rise and fall times. This characteristic may limit usage, as some applications may have sensitivity to signal waveform asymmetry.

SUMMARY

In an aspect of the present disclosure, a level shifter is provided. The level shifter includes a bias generator configured to generate a first bias signal and a second bias signal. The bias generator is configured to generate the first bias signal and the second bias signal without a buffer. The level shifter also includes a first latch in a first stage that is configured to translate a first voltage to a second voltage based on the first bias signal. The level shifter further includes a second latch in a second stage that is configured to translate the first voltage to a third voltage based on the second bias signal. The first bias signal is independent of the second bias signal.

In another aspect of the present disclosure, a method for operating a level shifter to shift a level of an input voltage is provided. The method includes receiving an input signal. The method also includes generating a first bias signal and a second bias signal. The first bias signal is generated independently of the second bias signal. The method also includes shifting a first voltage to a second voltage level based on the input signal, using the first bias signal or the second bias signal.

In yet another aspect of the present disclosure, a level shifter is provided. The level shifter includes a means for receiving an input signal. The level shifter also includes a means for generating a first bias signal and a second bias signal. The first bias signal is generated independently of the second bias signal. The level shifter further includes a means for shifting a first voltage to a second voltage level based on the input signal, using the first bias signal or the second bias signal.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
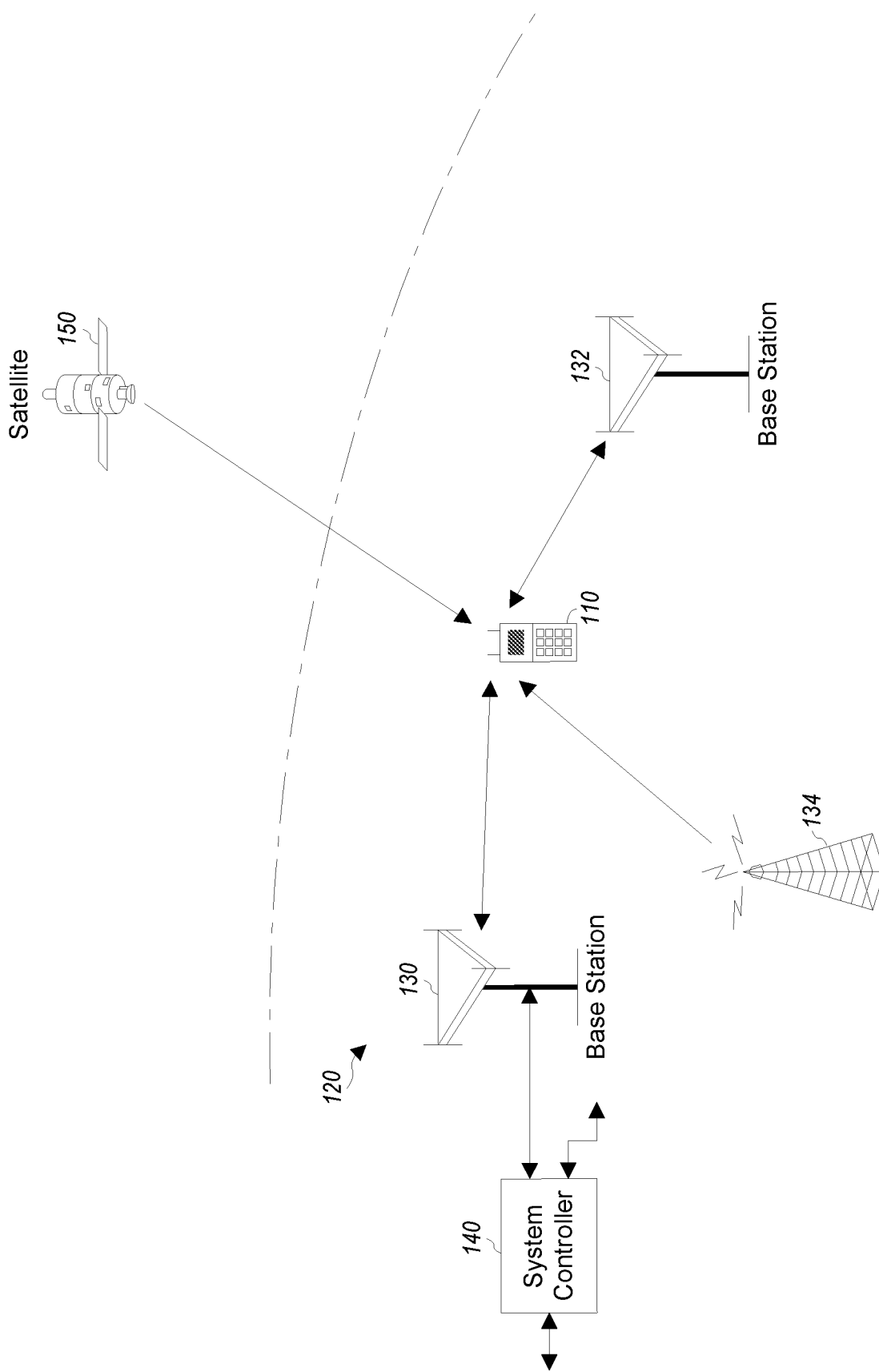
FIG. 1 shows a wireless device communicating with a wireless communications system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts. As described herein, the use of the term "and/or" is intended to represent an "inclusive OR", and the use of the term "or" is intended to represent an "exclusive OR".

A wireless communications device, such as a user equipment (UE), may include transmit chains that are composed of multiple radio frequency (RF) transmitters, multiple power amplifiers, multiple antennas, and one or more front end (FE) devices through which signals are transmitted from the UE. The transmit chains of the UE, however, may include a class of power amplifiers that are designed for meeting a power level specified for a current device generation.

The UE may be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

Level shifters are used in digital electronics such as smartphones, mobile computing devices, and other wireless communications devices. Level shifters change voltage levels from one state to another. Conventional level shifters, which transform a low voltage level to a high voltage level, may include several design challenges. Conventional level shifters may specify protection devices to ensure reliability as gate oxides of various transistors within the level shifter circuit may be vulnerable to damage from higher voltages. At the same time, the conventional level shifters are slow because the steps between voltage levels (e.g., low voltage level to a high voltage level) may be large. Additionally, the increased complexity of protection devices within the level shifter circuit may result in increased signal propagation delay, which ultimately limits a maximum operational speed of the digital electronics. It is also problematic that speed of the conventional level shifters may be highly variable. That is, the delay between the input and the output of conventional level shifters may vary significantly over all process corners (e.g., process, voltage, and temperature) and may result in damage to the device.

Furthermore, because the conventional bias generator circuit has many protection devices to ensure reliability of the level shifter, inclusion of these large devices may lead to an undesirable increase in form factor.

Aspects of the present disclosure are directed to a power amplifier including a fast pre-drive level shifter and a compact bias generator circuit. The level shifter of the present disclosure decouples the speed and reliability tradeoffs. That is, the voltage for the output stage of the level shifter is chosen independently of the first stage of the level shifter. Additionally, the level shifter may operate with few protection devices. Thus, the bias generator may reduce, and in some aspects significantly reduce, form factor (e.g., 80% area reduction).

FIG. 1 shows a wireless device 110 communicating with a wireless communications system 120. The wireless device 110 includes the level shifter and compact bias generator (e.g., 302 and 304, respectively of FIGS. 3 and 4). The wireless communications system 120 may be a 5G system, a long term evolution (LTE) system, a code division multiple access (CDMA) system, a global system for mobile communications (GSM) system, a wireless local area network (WLAN) system, millimeter wave (mmWave) technology, or some other wireless system. A CDMA system may implement wideband CDMA (WCDMA), time division synchronous CDMA (TD-SCDMA), CDMA2000, or some other version of CDMA. In a millimeter wave (mmWave) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
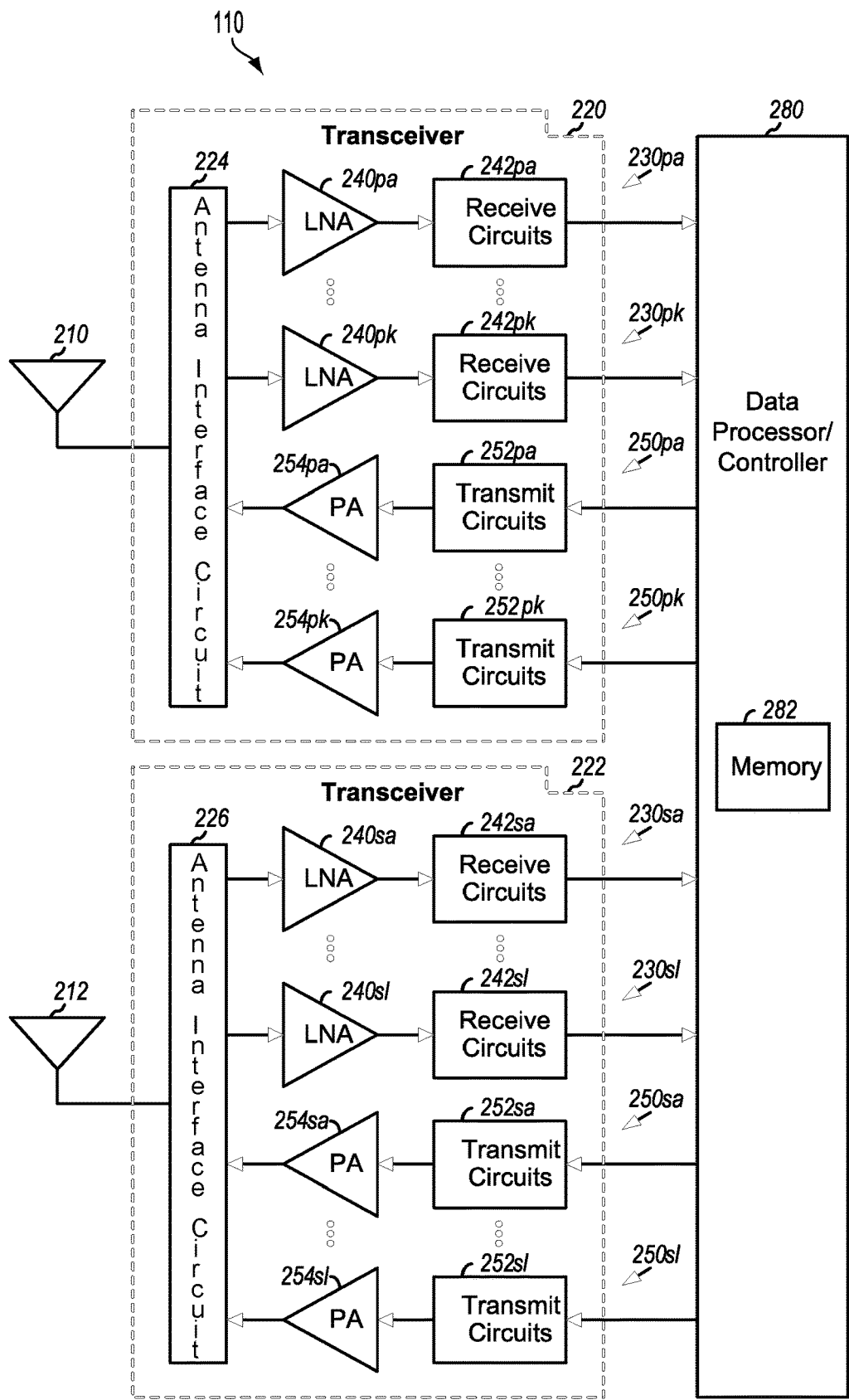
FIG. 2 shows a block diagram of the wireless device in FIG. 1, according to an aspect of the present disclosure.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes L receivers 230sa to 230sl and L transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230pa is the selected receiver. Within the receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230pa.

In the exemplary design shown in FIG. 2, each transmitter 250 includes transmit circuits 252 and a power amplifier (PA) 254. For example, the tri-level power supply architecture modulates the power supply to the power amplifier 254. For data transmission, a data processor 280 processes (e.g., encodes and modulates) data to be transmitted and provides an analog output signal to a selected transmitter. The description below assumes that the transmitter 250pa is the selected transmitter. Within the transmitter 250pa, transmit circuits 252pa amplify, filter, and upconvert the analog output signal from baseband to RF and provide a modulated RF signal. The transmit circuits 252pa may include amplifiers, filters, mixers, matching circuits, an oscillator, an LO generator, a PLL, etc. A power amplifier (PA) 254pa receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
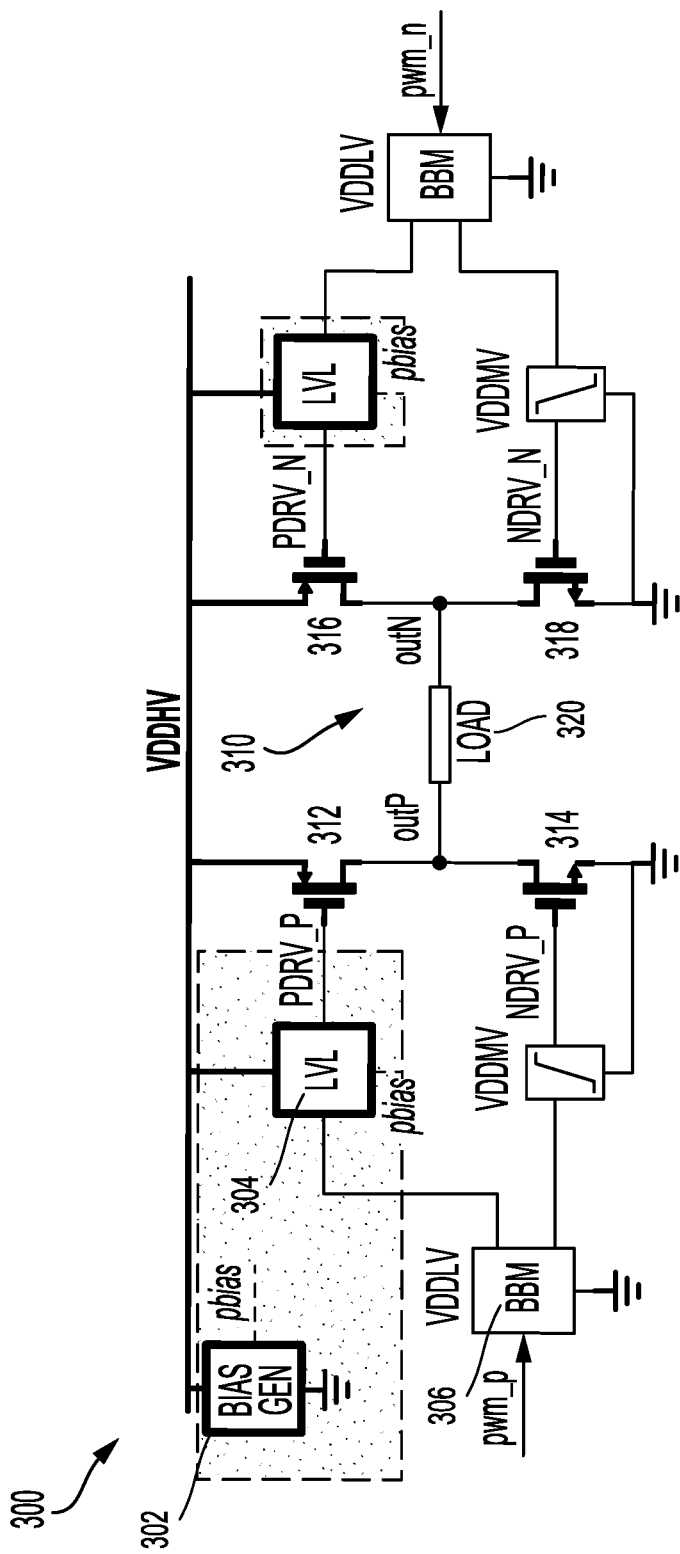
FIG. 3 is a simplified diagram illustrating a power amplifier of an electronic device, in accordance with aspects of the present disclosure.

FIG. 3 is a simplified diagram illustrating a power amplifier 300 of an electronic device, in accordance with aspects of the present disclosure. Referring to FIG. 3, the power amplifier 300 receives a high voltage supply VDDHV (e.g., 2.7 V 12 V) and converts the high voltage supply to provide various voltage levels suitable to power various components of an electronic device (e.g., a smartphone speaker output). The power amplifier 300 includes a bias generator 302, a level shifter 304, a break-before-make (BBM) module 306, a voltage source VDDMV (e.g., a battery), an H bridge 310 and a load 320. The bias generator 302 uses the high voltage supply to generate a bias (e.g., pbias), which may control the level shifter 304. The level shifter 304 translates or shifts the level of voltage supplied to the H bridge 310. The H bridge 310 changes the polarity of the voltage applied to a load 320. The H bridge 310 includes a pair of p-type metal oxide semiconductor (PMOS) transistors (e.g., 312, 316) and a pair of n-type metal oxide semiconductor (NMOS) transistors (e.g., 314, 318). The PMOS transistors 312 and 316 are driven by the level shifter 304 to translate or shift a ground referred signal to PDRV driven by the bias generation circuit 302.

Figure 4:
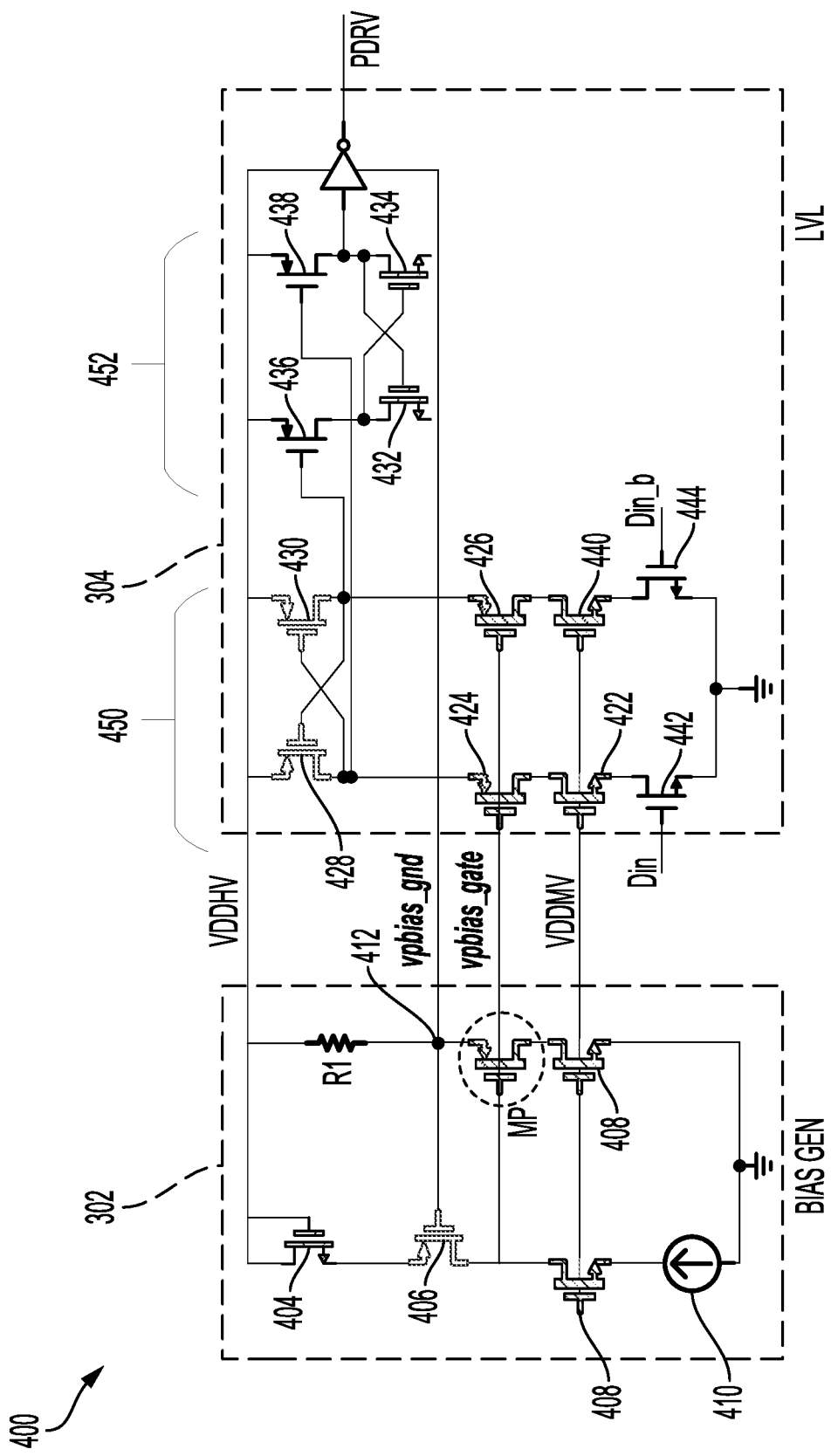
FIG. 4 is a diagram illustrating a more detailed bias generation circuit and the level shifter circuit of FIG. 3, in accordance with aspects of the present disclosure.

FIG. 4 is a diagram illustrating a more detailed bias generation circuit (e.g., 302) and level shifter circuit (e.g., 304) of FIG. 3, in accordance with aspects of the present disclosure. Referring to FIG. 4, the bias generator circuit 302 includes an NMOS transistor 404, PMOS transistors (406 and MP), a current source 410 and a resistor R1. The bias generator 302 receives a high voltage supply VDDHV via the NMOS transistor 404 and generates a first bias (e.g., vpbias_gnd) and a second bias (e.g., vpbias_gate). The current source 410 and resistor R1 supply a bias current along a second rail (e.g., PMOS transistors MP and R1) of the bias generator 302. In some aspects, the current source 410 may represent an equivalent circuit. For instance, in some aspects, the current source 410 could alternatively bean NMOS transistor. The bias generator 302 as shown in FIG. 4 is a single stage amplifier. The NMOS transistor 404 and PMOS transistor MP of the bias generator 302 may form a source follower circuit to generate a first bias and a second bias. NMOS transistors 408 serve as protection devices to guard against overvoltage or undervoltage, for example.

The level shifter 304 has a first stage 450 and a second stage 452. The first stage 450 includes a pair of cross-coupled PMOS transistors (e.g., 428 and 430) forming a first latch and the second stage 452 includes a pair of cross-coupled NMOS transistors (e.g., 432 and 434) forming a second latch. The level shifter 304 also includes a pair of PMOS transistors 424 and 426 that are protection devices for the level shifter 304. The PMOS transistors 424 and 426 clamp the voltage of their respective source nodes to be vpbias_gate+VGS (the voltage applied between the gate and source node for PMOS transistors 424 and 426) such that a following circuit (e.g. 438, 436) does not see or receive high voltages, where vpbias (e.g., vpbias_gate) is generated by the bias generator 302.

Additionally, the level shifter 304 also includes NMOS transistors 422 and 440 as protection devices that clamp the voltage of their respective drain nodes to VDDMV such that the input devices (e.g., 442 and 444) do not see or receive a high voltage (e.g., VDDHV) which may damage the devices (e.g., 442 and 444). By including such protection devices (e.g., NMOS transistors 422 and 440), the input devices (e.g., NMOS transistors 442 and 444 may be low-voltage rated devices, which occupy less surface area and enable faster speeds (reduced time between receiving input (e.g., Din, Din_b) and producing an output (e.g., PDRV). For ease of illustration only two input devices are shown, however many more such devices may be included in accordance with aspects of the present disclosure. Accordingly, by replacing high-voltage rated input devices included in conventional level shifters and bias generator circuits, with low input devices (e.g., 442 and 444) increased speed and reduced surface area may be achieved.

In some aspects, the NMOS transistor 404 of the bias generator 302 and the NMOS transistors 432 and 434 of the level shifter 304 may be substantially similar. That is, these NMOS transistors (e.g., 404, 432, and 434) may have similar dimensions such that transistors 432 and 434 may track with the NMOS transistor 404 across corners (e.g., process, voltage, and temperature). Similarly, in some aspects, PMOS transistors 428 and 430 in the first stage 450 of the level shifter 304 may be substantially similar to PMOS transistor 406 of the bias generator 302 and may have similar dimensions. Likewise, PMOS transistors 428 and 430 may track with PMOS transistor 406 across corners (e.g., process, voltage, and temperature).

In operation, the bias generator 302 receives the high voltage supply VDDHV. The high voltage supply VDDHV is coupled to the gate and drain of the NMOS transistor 404. The NMOS transistor 404 turns ON and provides the supply voltage to the source of the PMOS transistor 406. The PMOS transistor 406 in turn sets the lowest swing point for the output node (e.g., the first bias vpbias_gnd) at node 412. Notably, this is a low impedance node and absorbs the switching current from the latch (e.g., 432, 434) of the second stage 452 of the level shifter 304. The first bias (vpbias_gnd) may be applied to the second stage 452 latch (e.g., 432, 434). The voltage at a node 412 is also applied to the source of the PMOS transistor MP, which also serves as a protection PMOS replica and produces the second bias (vpbias_gate), which is supplied to the first stage 450 latch (e.g., 428,430). Notably, this high impedance node vpbias_gate may not conduct static or dynamic current. Further, because of the local feedback in the source follower loop of the PMOS transistor MP and the NMOS transistor 406, the bias generator 302 may operate without an additional buffer.

The level shifter 304 receives an input (e.g., Din and Din_b) via NMOS transistors 442 and 444. Based on the input, the level shifter 304 shifts or translates the high voltage supply VDDHV to produce an output voltage PDRV. The output PDRV may be produced via the separately biased first stage 450 or the second stage 452. That is, the level shifter 304 may produce an output via the first stage 450 using the first bias (vpbias_gnd) supplied by the bias generator 302 to turn PMOS gates (e.g., 312, 316) of the power amplifier 300 of FIG. 3 to an ON state. On the other hand, the level shifter 304 may produce an output via the second stage 452 using the second bias (e.g., vpbias_gate) to turn PMOS gates (e.g., 312, 316) of the power amplifier 300 of FIG. 3 to an OFF state.

Because the first stage 450 and the second stage of 452 of the level shifter 304 are separately biased, speed and reliability trade-offs faced in conventional level shifters may be decoupled such that the speed of the level shifter 304 may be increased without impacting reliability of the output. For instance, because the level shifter 304 may independently choose a bias (e.g., first bias or second bias), the delay time between receiving the input (e.g., Din, Din_b) and producing an output (e.g., PDRV) may be reduced. Furthermore, because the first bias (vpbias_gnd) is provided at a high impedance node thereby improving reliability, additional protection devices in conventional bias generator circuits, all of which may be high-voltage rated transistors, may be eliminated. In addition, compensation capacitors included in conventional bias generator circuits to stabilize the conventional bias generator circuits may also be eliminated. Thus, the bias generator 302 may have a substantially smaller footprint. That is, because protection devices may be large (high-voltage rated), the bias generator 302 of the present disclosure, which may be operated without such devices (or with low-voltage rated devices as replacements) may occupy less area, and in some aspects, a substantial area reduction may be achieved (e.g., 80% area reduction).

Figure 5:
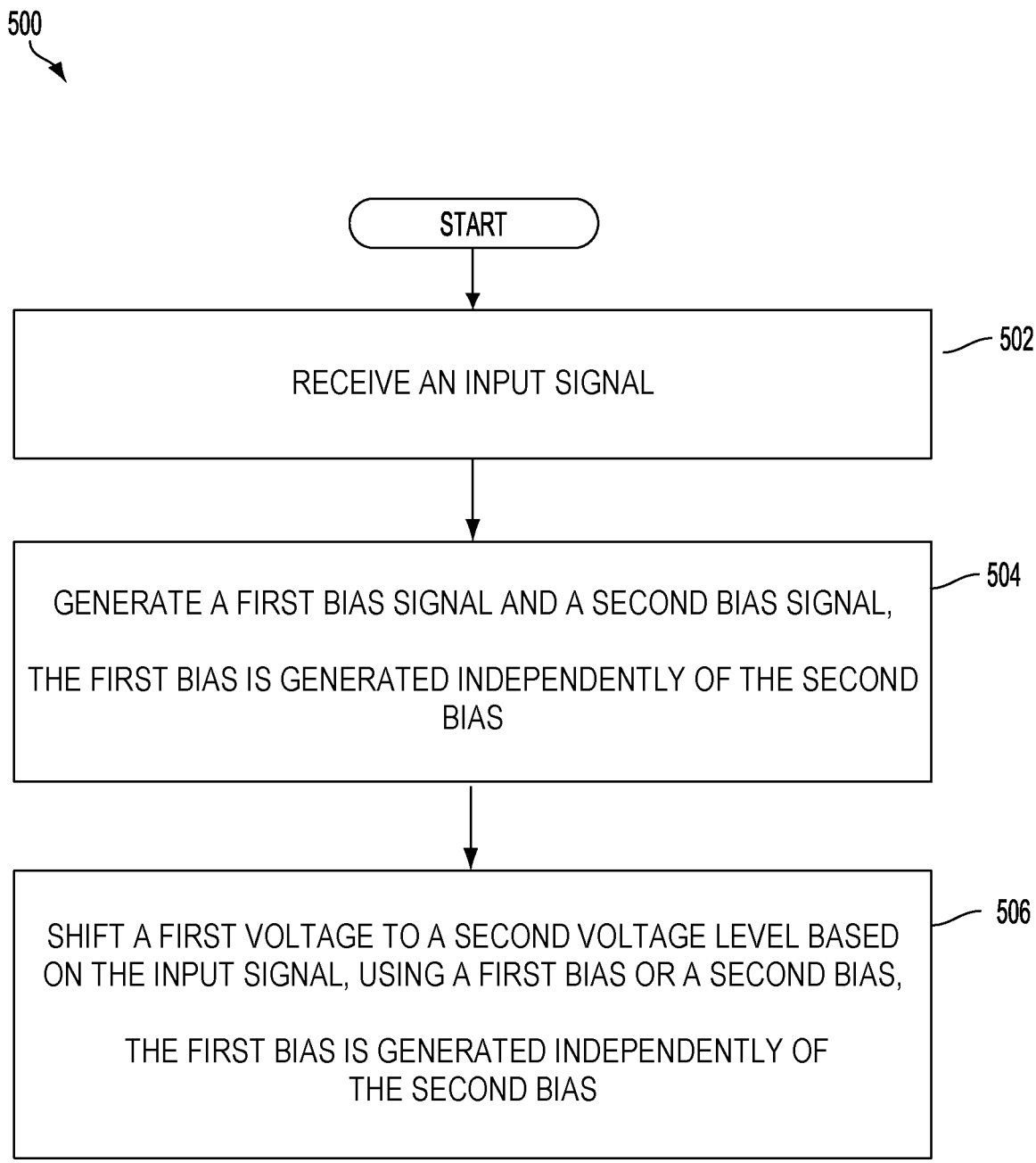
FIG. 5 is flow diagram of a method of shifting a level of an input voltage, in accordance with aspects of the present disclosure.

FIG. 5 is flow diagram of a method 500 of shifting a level of an input voltage, in accordance with aspects of the present disclosure. At block 502, the process receives an input signal. Referring to FIG. 4, the level shifter 304 receives an input (e.g., Din and Din_b) via NMOS transistors 442 and 444.

At block 504, the process generates a first bias signal and a second bias signal, the first bias generated independently of the second bias. Referring to FIG. 4, the bias generator 302 receives the high voltage supply VDDHV. The high voltage supply VDDHV is coupled to the gate and drain of the NMOS transistor 404. The NMOS transistor 404 turns ON and provides the supply voltage to the source of the PMOS transistor 406. The PMOS transistor 406 in turn sets the lowest swing point for the output node (e.g., the first bias vpbias_gnd) at node 412. Notably, this is a low impedance node and absorbs the switching current from the latch (e.g., 432,434) of the second stage 452 of level shifter 304. The first bias (vpbias_gnd) may be applied to the second stage 452 latch (e.g., 432, 434). The voltage at a node 412 is also applied to the source of the PMOS transistor MP, which also serves as a protection PMOS replica and produces the second bias (vpbias_gate) supplied to the first stage 450 latch (e.g., 428,430). Notably, this high impedance node vpbias_gate may not conduct static or dynamic current. Further, because of the local feedback in the source follower loop of the PMOS transistor MP and NMOS transistor 406, the bias generator 302 may operate without an additional buffer.

At block 506, the process shifts a first voltage to a second voltage level based on the input signal, using a first bias or a second bias. The first bias is generated independently of the second bias. Referring to FIG. 4, the level shifter 304 receives an input (e.g., Din and Din_b) via NMOS transistors 442 and 444. Based on the input, the level shifter 304 shifts or translates the high voltage supply VDDHV to produce an output voltage PDRV. The output voltage PDRV may be produced via the separately biased first stage 450 or the second stage 452. That is, the level shifter 304 may be produce an output via the first stage 450 using the first bias (vpbias_gnd) supplied by the bias generator 302 to turn the PMOS gates (e.g., 312, 316) of the power amplifier 300 to an ON state. On the other hand, the level shifter 304 may produce an output via the second stage 452 using the second bias (e.g., vpbias_gate) to turn the PMOS gates (e.g., 312, 316) of the power amplifier 300 of FIG. 3 to an OFF state.

Because the first stage 450 and the second stage of 452 of the level shifter 304 are separately biased, speed and reliability trade-offs faced in conventional level shifters may be decoupled such that the speed of level shifter 304 may be increased without impacting reliability of the output. For instance, because the level shifter 304 may independently choose a bias (first bias or second bias), the delay time between receiving the input (e.g., Din, Din_b) and producing an output (e.g., PDRV) may be reduced. Furthermore, because the first bias (vpbias_gnd) is provided at a high impedance node thereby improving reliability, additional protection devices in conventional bias generator circuits may be eliminated. Thus, the bias generator 302 may have a substantially smaller footprint. That is, because protection devices are typically large, the bias generator 302 of the present disclosure may occupy less area and in some aspects a substantial area reduction may be achieved (e.g., 80% area reduction). In this way, the bias generator 302 may be compact compared to conventional bias generation circuits.

According to one aspect of the present disclosure, a level shifter with independently biased stages is described. The level shifter includes means for receiving an input. The level shifter also includes means for shifting a first voltage to a second voltage level based on the input signal, using a first bias or a second bias. The level shifter includes a means for generating a first bias and a means for generating a second bias. The first bias is independent of the second bias. The means for shifting may, for example, be the first stage 450, the second stage 452, PMOS transistors (e.g., 428, 430), and/or the NMOS transistors (e.g., 432, 434). The means for generating a first bias and means for generating a second bias may, for example, be the bias generator 302, the NMOS transistor 406, and/or the PMOS transistor MP. In another aspect, the aforementioned means may be any module or any apparatus or material configured to perform the functions recited by the aforementioned means.

Figure 6:
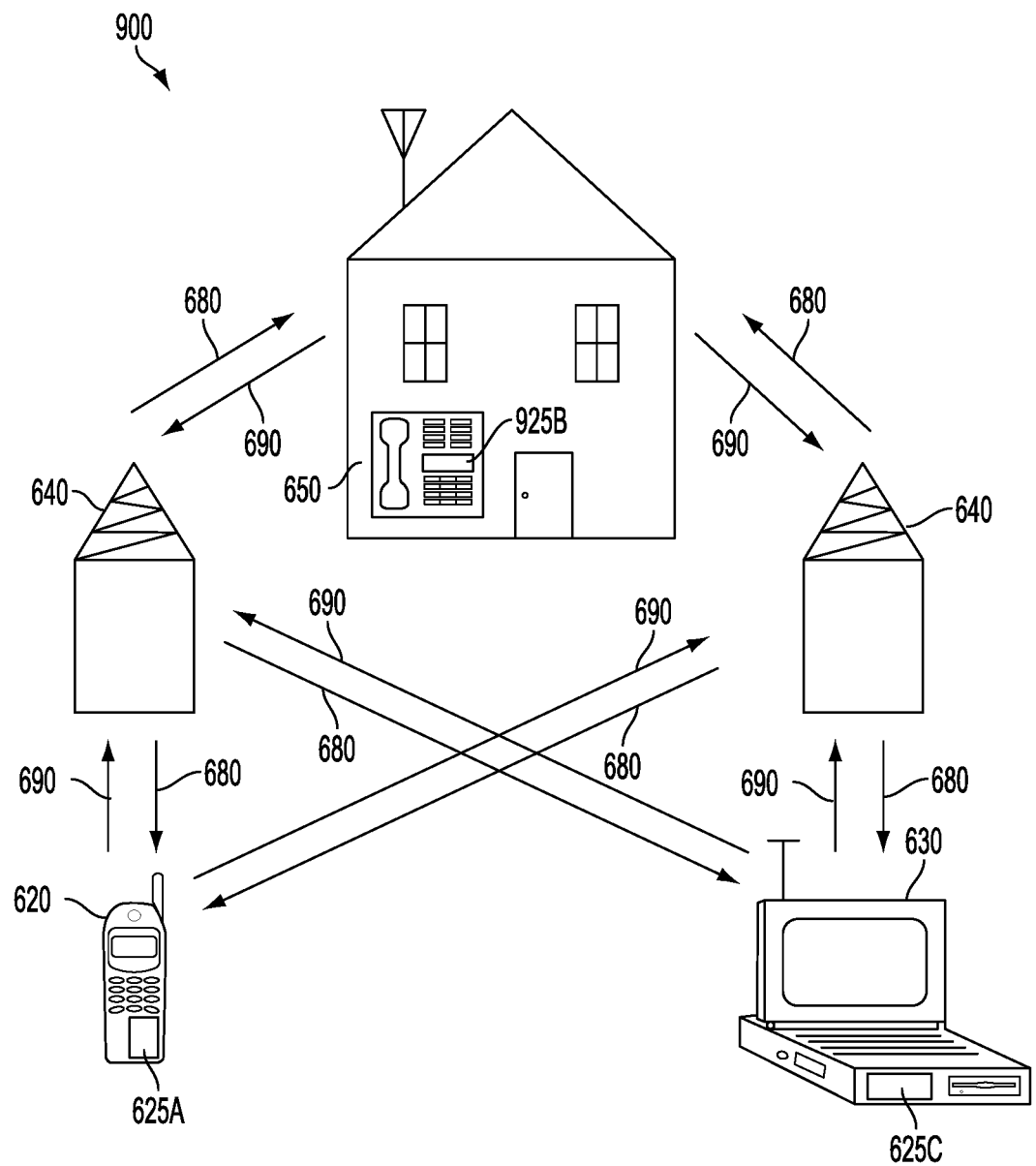
FIG. 6 is a block diagram showing an exemplary wireless communications system in which a configuration of the disclosure may be advantageously employed.

FIG. 6 is a block diagram showing an exemplary wireless communications system in which a configuration of the disclosure may be advantageously employed. For purposes of illustration, FIG. 6 shows three remote units 620, 630, and 650 and two base stations 640. It will be recognized that wireless communications systems may have many more remote units and base stations. Remote units 620, 630, and 650 include IC devices 625A, 625B, and 625C that include the disclosed level shifter and compact bias generator. It will be recognized that other devices may also include the disclosed level shifter and compact bias generator, such as the base stations, switching devices, and network equipment. FIG. 6 shows forward link signals 680 from the base station 640 to the remote units 620, 630, and 650 and reverse link signals 690 from the remote units 620, 630, and 650 to base station 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the level shifter and compact bias generator.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random-access memory (RAM), read-only memory (ROM), electrically erasable programmable ROM (EEPROM), CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A level shifter, comprising:
a bias generator configured to generate a first bias signal and a second bias signal, the bias generator configured to generate the first bias signal and the second bias signal using a high voltage supply, the first bias signal being generated independently of the second bias signal;
a first latch in a first stage configured to translate a first voltage to a second voltage based on the first bias signal; and
a second latch in a second stage configured to translate the first voltage to a third voltage based on the second bias signal, in which the third voltage is generated independently of the second voltage.

2. The level shifter of claim 1, in which the bias generator includes no more than two protection devices.

3. The level shifter of claim 1, in which the first bias signal is supplied via a low impedance node.

4. The level shifter of claim 3, in which the low impedance node is configured to absorb switching current from the second latch.

5. The level shifter of claim 1, in which an overdrive for the first stage and the second stage is the same for a different process, voltage and temperature.

6. The level shifter of claim 1, in which the bias generator further includes a transistor configured to absorb dynamic current from the first latch.

7. A method for operating a level shifter to shift a level of an input voltage, comprising:
receiving an input signal;
generating a first bias signal and a second bias signal, the first bias signal is generated independently of the second bias signal using a high voltage supply; and
shifting a first voltage to a second voltage based on the input signal, using the first bias signal or to a third voltage based on the input signal using the second bias signal, in which the third voltage is generated independently of the second voltage.

8. The method of claim 7, further comprising supplying the first bias signal to a second stage of the level shifter via a low impedance node.

9. The method of claim 7, further comprising supplying the second bias signal to a first stage of the level shifter via a high impedance node.

10. A level shifter, comprising:
means for receiving an input signal;
means for generating a first bias signal and a second bias signal, the first bias signal is generated independently of the second bias signal using a high voltage supply; and
means for shifting a first voltage to a second voltage based on the input signal, using the first bias signal or to a third voltage based on the input signal using the second bias signal, in which the third voltage is generated independently of the second voltage.

11. The level shifter of claim 10, further comprising means for supplying the first bias signal to a second stage of the level shifter via a low impedance node.

12. The level shifter of claim 10, further comprising means for supplying the second bias signal to a first stage of the level shifter via a high impedance node.

13. The level shifter of claim 10, in which the first bias signal is supplied via a low impedance node.

14. The level shifter of claim 13, in which the low impedance node is configured to absorb switching current from the second latch.

15. The level shifter of claim 10, in which an overdrive for the first stage and the second stage is the same for a different process, voltage and temperature.

16. The level shifter of claim 10, in which the generating means further includes means for absorbing dynamic current from the first latch.

* * * * *